(12) United States Patent
Sun et al.

(10) Patent No.: US 12,320,832 B2
(45) Date of Patent: Jun. 3, 2025

(54) SIGNAL RECEIVING DEVICE, SIGNAL IDENTIFICATION SYSTEM AND METHOD

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Tuo Sun, Beijing (CN); Yanli Wang, Beijing (CN); Xiyu Zhao, Beijing (CN); Mengyang Wen, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/261,070

(22) PCT Filed: May 31, 2022

(86) PCT No.: PCT/CN2022/096431
§ 371 (c)(1),
(2) Date: Jul. 11, 2023

(87) PCT Pub. No.: WO2023/230905
PCT Pub. Date: Dec. 7, 2023

(65) Prior Publication Data
US 2025/0012837 A1    Jan. 9, 2025

(51) Int. Cl.
*G01R 29/08*    (2006.01)

(52) U.S. Cl.
CPC .................. *G01R 29/0892* (2013.01)

(58) Field of Classification Search
None
See application file for complete search history.

(56) References Cited

U.S. PATENT DOCUMENTS

| 2016/0204821 | A1* | 7/2016 | Han | G01R 29/10 |
| | | | | 324/602 |
| 2019/0011487 | A1* | 1/2019 | Bassen | G01R 29/0871 |
| 2020/0011913 | A1* | 1/2020 | Hisatake | G01R 29/0885 |
| 2021/0373061 | A1* | 12/2021 | Hisatake | G01R 29/10 |
| 2023/0273873 | A1* | 8/2023 | Patki | G06F 11/366 |
| | | | | 714/38.11 |

* cited by examiner

*Primary Examiner* — Wilson Lee
(74) *Attorney, Agent, or Firm* — XSENSUS LLP

(57) ABSTRACT

A signal receiving device includes a first receiving circuit, a second receiving circuit, a third receiving circuit and a light-emitting device. The first receiving circuit is configured to receive a first electromagnetic wave and obtain a first signal from the first electromagnetic wave. The second receiving circuit is coupled to the first receiving circuit, and is configured to amplify an amplitude of the first signal output from the first receiving circuit to obtain a second signal. The third receiving circuit is configured to receive a third signal and output a fourth signal. The light-emitting device is coupled between the second receiving circuit and the third receiving circuit, and is configured to be in an off state when the second signal is the same as the fourth signal and in a light-emitting state when the second signal is different from the fourth signal.

17 Claims, 3 Drawing Sheets

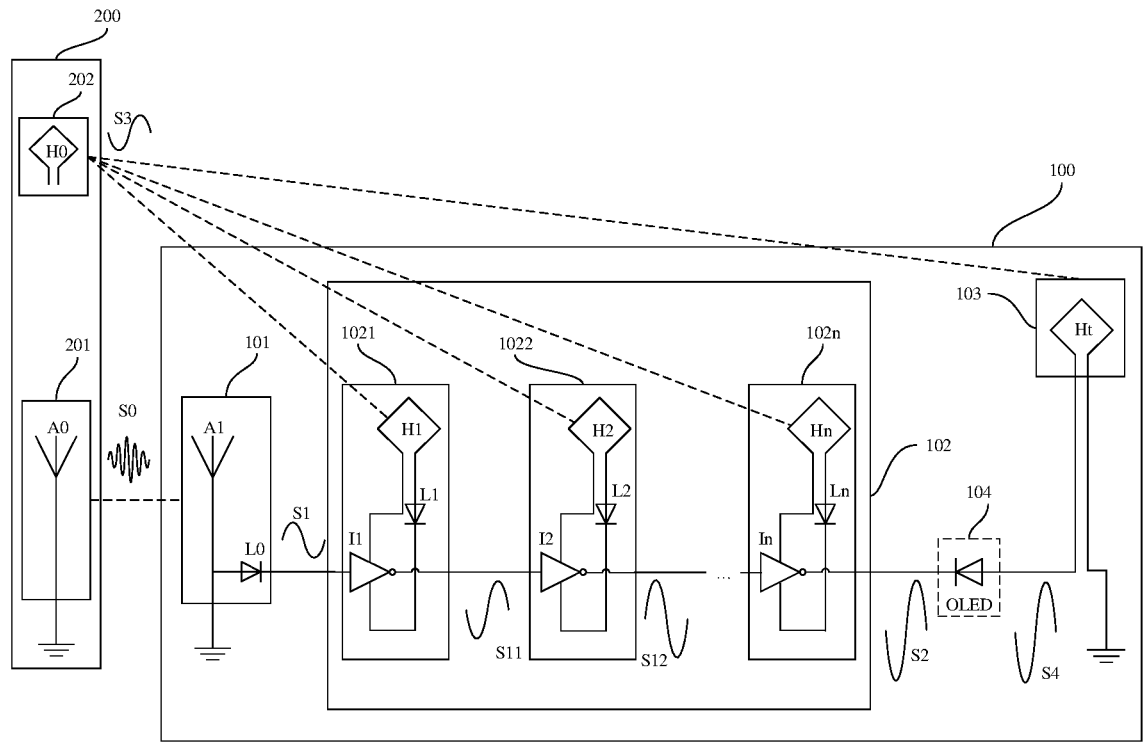

FIG. 5

601 — The first receiving circuit receives the first electromagnetic wave from the first transmitting circuit, and obtains the first signal from the first electromagnetic wave; the first transmitting circuit is configured to modulate the first signal onto the first carrier wave to generate the first electromagnetic wave 602 — The second receiving circuit amplifies the amplitude of the first signal output from the first receiving circuit to obtain the second signal 603 — The third receiving circuit receives the third signal from the second transmitting circuit, and outputs the fourth signal; the light-emitting device is in the off state when the second signal is the same as the fourth signal; the light-emitting device is in the light-emitting state when the second signal is different from the fourth signal

FIG. 6

SIGNAL RECEIVING DEVICE, SIGNAL IDENTIFICATION SYSTEM AND METHOD

CROSS-REFERENCE TO RELATED APPLICATION

This application is a national phase entry under 35 USC 371 of International Patent Application No. PCT/CN 2022/096431 filed on May 31, 2022, which is incorporated herein by reference in its entirety.

TECHNICAL FIELD

The present disclosure relates to the field of signal identification, and in particular, to a signal receiving device, a signal identification system and a signal identification method.

BACKGROUND

In order to identify an electromagnetic signal, an inductor may be coupled to a light-emitting device, and when the inductor senses the electromagnetic signal, the inductor may generate a driving current to drive the light-emitting device to emit light. Whether the electromagnetic signal exists may be determined by identifying a brightness of the light-emitting device.

SUMMARY

In an aspect, a signal receiving device is provided. The signal receiving device includes a first receiving circuit, a second receiving circuit, a third receiving circuit and a light-emitting device. The first receiving circuit is configured to receive a first electromagnetic wave and obtain a first signal from the first electromagnetic wave. The first electromagnetic wave is an electromagnetic wave generated by modulating the first signal onto a first carrier wave. The second receiving circuit is coupled to the first receiving circuit, and is configured to amplify an amplitude of the first signal output from the first receiving circuit to obtain a second signal. The third receiving circuit is configured to receive a third signal and output a fourth signal. The light-emitting device is coupled between the second receiving circuit and the third receiving circuit, and is configured to be in an off state when the second signal is the same as the fourth signal and in a light-emitting state when the second signal is different from the fourth signal.

In some embodiments, the second receiving circuit is further configured to receive the third signal.

In some embodiments, the second receiving circuit includes a plurality of stages of receiving sub-circuits connected in series. Each stage of receiving sub-circuit includes an amplifying device, a first inductor and a rectifying device. The amplifying device is coupled to the first receiving circuit, and is configured to amplify the amplitude of the first signal output from the first receiving circuit. The first inductor is coupled to the amplifying device, and is configured to receive the third signal and supply power to the amplifying device. The rectifying device is coupled between the amplifying device and the first inductor, and is configured to rectify an induced current generated by the first inductor.

In some embodiments, inductance values of first inductors in the plurality of stages of receiving sub-circuits connected in series are increased stage by stage.

In some embodiments, the amplifying device is an amplifier or an inverter.

In some embodiments, the first signal and the third signal are same in frequency, and the first signal and the third signal are same or opposite in phase.

In some embodiments, in a case where the amplifying device is the inverter, the second receiving circuit includes an even number of inverters when the first signal and the third signal are same in phase; the second receiving circuit includes an odd number of inverters when the first signal and the third signal are opposite in phase.

In some embodiments, the third receiving circuit includes a second inductor, and an inductance value of the second inductor is greater than an inductance value of the first inductor.

In some embodiments, an inductance value of a first inductor in a last-stage receiving sub-circuit in the plurality of stages of receiving sub-circuits is same as the inductance value of the second inductor.

In another aspect, a signal identification system is provided. The signal identification system includes a signal transmitting device and the signal receiving device in any one of the above embodiments. The signal transmitting device includes a first transmitting circuit and a second transmitting circuit. The first transmitting circuit is configured to modulate the first signal onto the first carrier wave to generate the first electromagnetic wave. The second transmitting circuit is configured to transmit the third signal.

In some embodiments, a frequency of the first signal is in a range of 1 kHz to 20 KHz, inclusive.

In some embodiments, the first receiving circuit includes a first antenna, and the first transmitting circuit includes a second antenna. A frequency of the first antenna is same as or similar to a frequency of the second antenna.

In some embodiments, the frequency of the first antenna and the frequency of the second antenna are each greater than or equal to 100 MHz.

In yet another aspect, a signal identification method is provided. The signal identification method is applied to the signal identification system in any one of the above embodiments. The signal identification method includes following steps.

The first receiving circuit receives the first electromagnetic wave from the first transmitting circuit, and obtains the first signal from the first electromagnetic wave.

The second receiving circuit amplifies the amplitude of the first signal output from the first receiving circuit to obtain the second signal.

The third receiving circuit receives the third signal from the second transmitting circuit, and outputs the fourth signal. The light-emitting device is in the off state when the second signal is the same as the fourth signal; the light-emitting device is in the light-emitting state when the second signal is different from the fourth signal.

In some embodiments, an amplification factor of each stage of receiving sub-circuit is 3 to 5.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

FIG. 5 is a circuit diagram of yet another signal identification system, in accordance with some embodiments; and FIG. 6 is a flow diagram of a signal identification method, in accordance with some embodiments.

DETAILED DESCRIPTION

Figure 1:
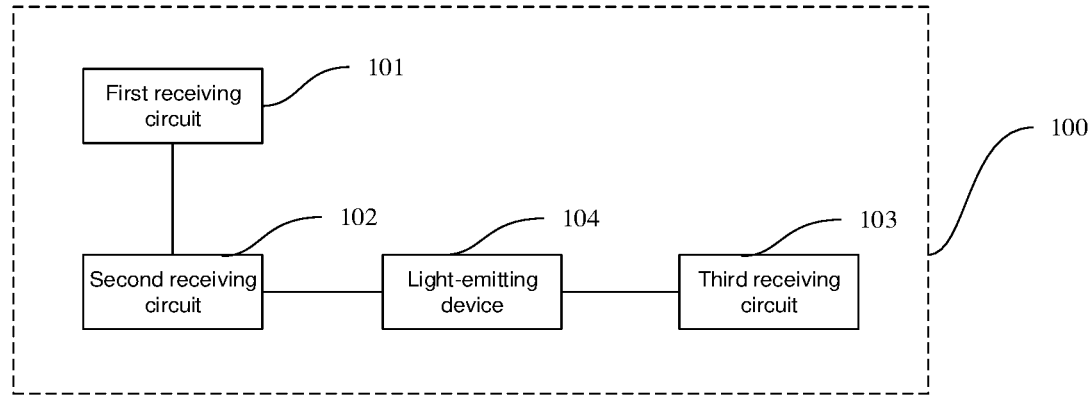
FIG. 1 is a block diagram showing a structure of a signal identification system, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and extensions thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Generally, a method of identifying an electromagnetic signal is to couple an inductor (also referred to as a coil) to a light-emitting device, and when the inductor senses the electromagnetic signal, the inductor may generate a driving current to drive the light-emitting device to emit light. Whether the electromagnetic signal exists may be determined by identifying a brightness of the light-emitting device.

The inductor has a poor distinguishing capability for an electromagnetic signal with a low frequency, and in a low-frequency range, such as a frequency range of 1 kHz to 20 KHz, efficiencies of electromagnetic signals with different frequencies received by the same inductor are similar. Therefore, the technology of using the inductor to be coupled to the light-emitting device to identify the electromagnetic signal can only distinguish whether the electromagnetic signal exists or not, and cannot further distinguish an electromagnetic signal with a specific frequency. For example, when the inductor senses an electromagnetic signal with a frequency of 12 kHz, the brightness of the light-emitting device is a first brightness, and when the inductor senses an electromagnetic signal with a frequency of 18 kHz, the brightness of the light-emitting device is a second brightness. Since the efficiencies of the electromagnetic signals with different frequencies received by the same inductor are similar, the first brightness and the second brightness have a small difference therebetween, so that the first brightness and the second brightness are indistinguishable. That is, if the object is to identify the electromagnetic signal with the frequency of 12 kHz, it cannot be accurately identified whether the electromagnetic signal sensed by the inductor is the electromagnetic signal with the frequency of 12 kHz or the electromagnetic signal with the frequency of 18 kHz by the above method.

Moreover, due to a low center frequency requirement of the inductor when an electromagnetic signal is identified by the above method, a receiving terminal is easy to be forged. For example, an electromagnetic signal received by a first receiving terminal is set to be the electromagnetic signal with the frequency of 12 kHz, and an electromagnetic signal received by a second receiving terminal is set to be the electromagnetic signal with the frequency of 18 kHz. Since the first brightness and the second brightness are indistinguishable, the first receiving terminal and the second receiving terminal are indistinguishable. That is, the first receiving terminal may be forged as the second receiving terminal, and the second receiving terminal may also be forged as the first receiving terminal.

To solve the above problem, some embodiments of the present disclosure provide a signal identification system. As shown in FIG. 1, the signal identification system includes a signal receiving device 100. The signal receiving device 100 includes a first receiving circuit 101, a second receiving circuit 102, a third receiving circuit 103 and a light-emitting device 104.

The first receiving circuit 101 is configured to receive a first electromagnetic wave S0 and obtain a first signal S1 from the first electromagnetic wave S0. The first electromagnetic wave S0 is an electromagnetic wave generated by modulating the first signal S1 onto a first carrier wave.

Figure 2:
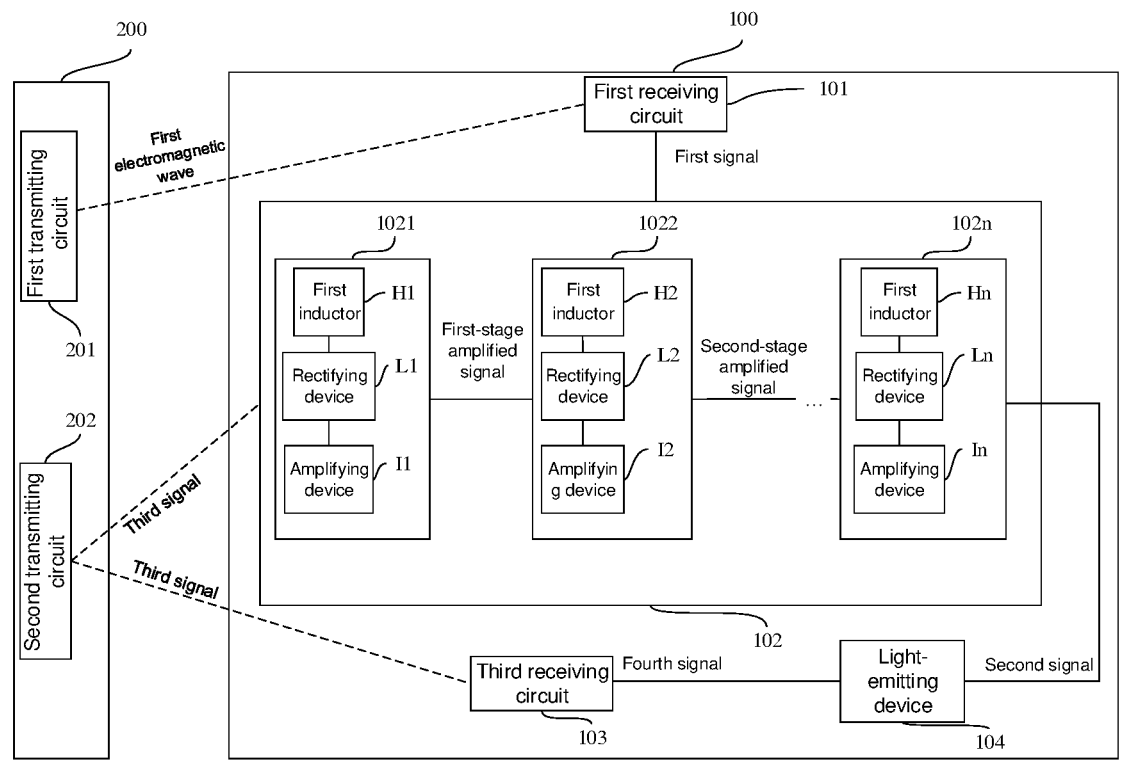
FIG. 2 is a block diagram showing a structure of another signal identification system, in accordance with some embodiments.

In some embodiments, as shown in FIG. 2, the signal identification system further includes a signal transmitting device 200. The signal transmitting device 200 includes a first transmitting circuit 201. The first transmitting circuit 201 is configured to modulate the first signal S1 onto the first carrier wave to generate the first electromagnetic wave S0. That is, the first receiving circuit 101 may receive the first electromagnetic wave S0 from the first transmitting circuit 201.

Figure 3:
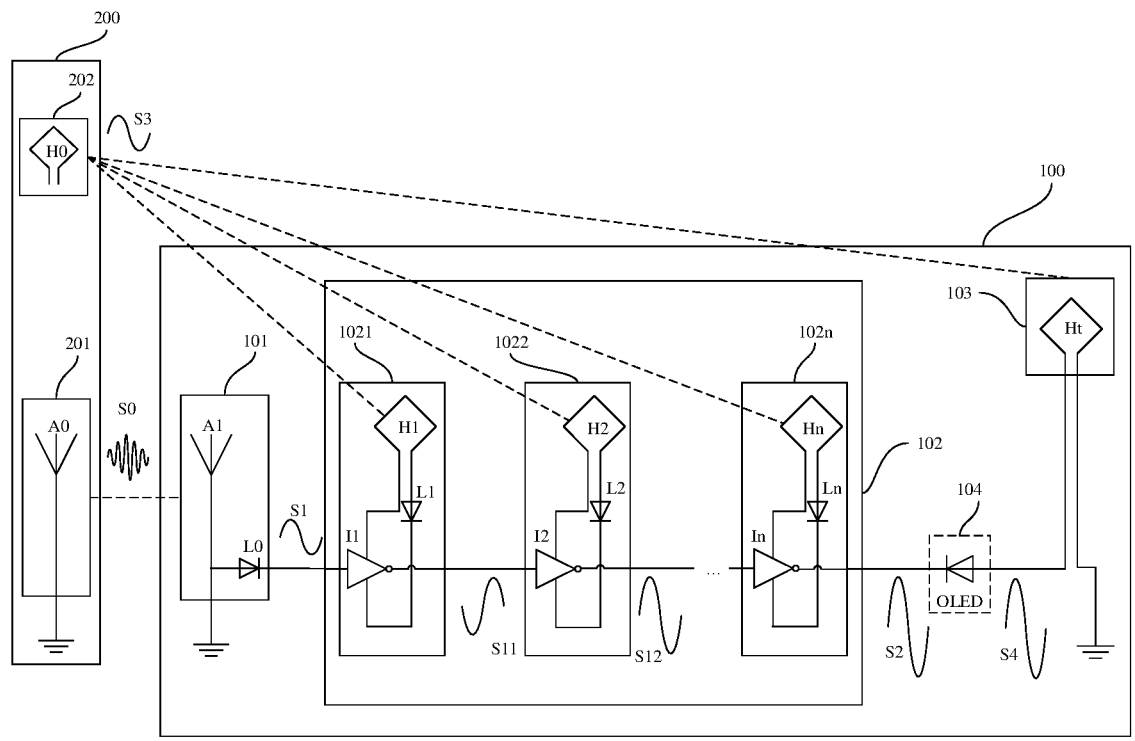
FIG. 3 is a circuit diagram of a signal identification system, in accordance with some embodiments.

In some embodiments, as shown in FIG. 3, the first receiving circuit 101 includes a first antenna A1 and a filter. For example, the filter may be a diode L0. The first transmitting circuit 201 includes a second antenna A0, and frequencies of the first antenna A1 and the second antenna A0 are the same or similar. For example, the frequencies of the first antenna A1 and the second antenna A0 are similar, which means that a difference between the frequency of the first antenna A1 and the frequency of the second antenna A0 is less than or equal to 10 MHz. That is, in a case where the difference between the frequency of the first antenna A1 and the frequency of the second antenna A0 is within 10 MHz, signal transmission is possible between the first antenna A1 and the second antenna A0. Moreover, in a case where the frequencies of the first antenna A1 and the second antenna A0 are the same or similar, an efficiency of the signal transmission between the first antenna A1 and the second antenna A0 is high. That is, a signal from the second antenna A0 may be received by the first antenna A1 to a maximum extent, so that distortion of data received by the first antenna A1 may be avoided as much as possible.

For example, in a case where a center frequency of the second antenna A0 is 100 MHz, if the frequency of the first antenna A1 is in a range of 95 MHz to 105 MHz, inclusive, the frequencies of the first antenna A1 and the second antenna A0 are the same or similar, and the signal transmission may be performed between the first antenna A1 and the second antenna A0.

In some embodiments, the frequency of the first antenna A1 and the frequency of the second antenna A0 are each greater than or equal to 100 MHz. For example, in a case where the frequencies of the first antenna A1 and the second antenna A0 are 100 MHz, the second antenna A0 modulates the first signal S1 onto the first carrier wave with 100 MHz to generate the first electromagnetic wave S0. As shown in FIG. 3, the second antenna A0 transmits the first electromagnetic wave S0, and the first antenna A1 receives the first electromagnetic wave S0, and then outputs the first electromagnetic wave S0 to the filter. The filter processes the first electromagnetic wave S0 to obtain the first signal S1.

As shown in FIGS. 1 to 3, the second receiving circuit 102 is coupled to the first receiving circuit 101, and is configured to amplify an amplitude of the first signal S1 output from the first receiving circuit 101 to obtain a second signal S2. In some embodiments, as shown in FIGS. 2 and 3, the second receiving circuit 102 is further configured to receive a third signal S3 to generate a current. It will be understood that the current may supply power to electronic elements of the second receiving circuit 102. That is, the second receiving circuit 102 does not need an external power source, so that a volume of the signal identification system may be reduced to realize a flexible system.

In some embodiments, as shown in FIG. 2, the signal transmitting device 200 further includes a second transmitting circuit 202 configured to transmit the third signal S3. That is, the second receiving circuit 102 may receive the third signal S3 from the second transmitting circuit 202.

As shown in FIGS. 1 and 2, the third receiving circuit 103 is configured to receive the third signal S3 from the second transmitting circuit 202 and output a fourth signal S4. Based on the principle of electromagnetic induction, the fourth signal S4 has the same phase as the third signal S3, and amplitudes of the fourth signal S4 and the third signal S3 may be the same or different.

In some embodiments, as shown in FIG. 3, the second transmitting circuit 202 includes an inductor H0, and the third receiving circuit 103 includes a second inductor Ht. When the inductor H0 transmits the third signal S3, due to electromagnetic induction between the inductors, the second inductor Ht may sense the third signal S3 and output the fourth signal S4 while generating a current, and the current may supply power to the light-emitting device 104 to cause the light-emitting device 104 to emit light.

Figure 4:
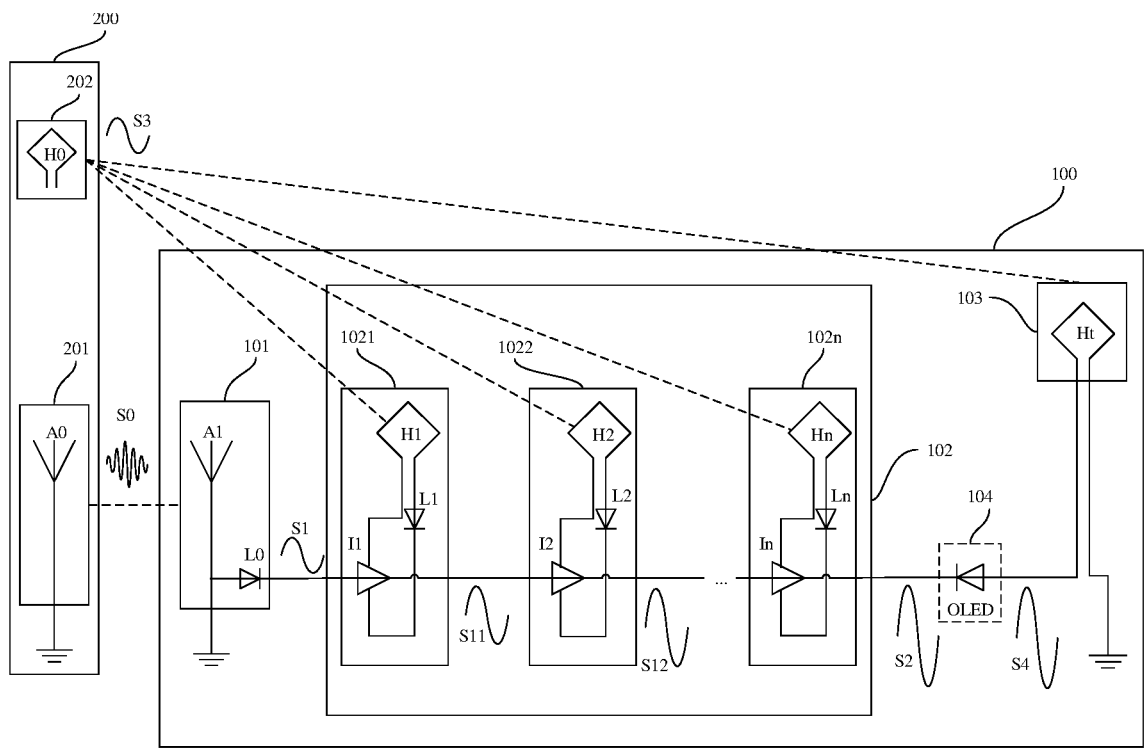
FIG. 4 is a circuit diagram of another signal identification system, in accordance with some embodiments.

In some embodiments, the first signal S1 has the same frequency as the third signal S3, and the first signal S1 and the third signal S3 are same or opposite in phase. FIGS. 3 and 4 exemplarily illustrate that the first signal S1 and the third signal S3 have the same frequency and the same phase. In practical applications, the first signal S1 and the third signal S3 may be opposite in phase. That is, a difference between the phase of the first signal S1 and the phase of the third signal S3 is 180°.

As shown in FIGS. 1 and 2, the light-emitting device 104 is coupled between the second receiving circuit 102 and the third receiving circuit 103, and is configured to be in an off state when the second signal S2 is the same as the fourth signal S4 and in a light-emitting state when the second signal S2 is different from the fourth signal S4.

For example, the light-emitting device 104 is in the off state when the second signal S2 is the same as the fourth signal S4, which means that when the second signal S2 is the same as the fourth signal S4, the light-emitting device 104 is always in the off state. The light-emitting device 104 is in the light-emitting state when the second signal S2 is different from the fourth signal S4, which means that when the second signal S2 is different from the fourth signal S4, the light-emitting device 104 is always in the light-emitting state, or the light-emitting device 104 is in a high-frequency flickering state. It will be understood that when the light-emitting device 104 is in the high-frequency flickering state, the light-emitting device 104 is switched between the light-emitting state and the off state at a high frequency.

For example, as shown in FIG. 3, the light-emitting device 104 may be an organic light-emitting diode (OLED), a quantum dot light-emitting diode (QLED), or an active-matrix organic light-emitting diode (AMOLED). A specific type of the light-emitting device 104 is not specially limited in the embodiments of the present disclosure. In following embodiments, a detailed description will be made in an example where the light-emitting device 104 is a light-emitting diode OLED. An anode of the light-emitting diode OLED is coupled to the second inductor Ht, and a cathode of the light-emitting diode OLED is coupled to an output terminal of the second receiving circuit 102. The light-emitting diode OLED has a threshold of current or voltage due to structural characteristics of the light-emitting diode OLED. For example, when a voltage difference between two ends of the light-emitting diode OLED is greater than or equal to the threshold voltage, the light-emitting diode OLED emits light; when the voltage difference between the two ends of the light-emitting diode OLED is less than the threshold voltage, the light-emitting diode OLED is turned off. It will be understood that, when the second signal S2 has the same phase as the fourth signal S4, and a difference between amplitudes of the second signal S2 and the fourth signal S4 is less than the threshold voltage of the light-emitting diode OLED, the light-emitting diode OLED is turned off. That is, the second signal S2 is the same as the fourth signal S4, which may include that the amplitudes of the second signal S2 and the fourth signal S4 are completely the same, or may include that the amplitudes of the second signal S2 and the fourth signal S4 are almost the same (for example, the difference between the amplitudes of the second signal S2 and the fourth signal S4 is less than the threshold voltage of the light-emitting diode OLED).

As shown in FIGS. 2 and 3, when a current flows through the inductor H0, based on the principle of electromagnetic induction, the third signal S3 is generated inside and around the inductor H0, and the second inductor Ht senses the third signal S3 to generate a current, and this current may drive the light-emitting diode OLED to emit light and output the fourth signal S4 to the anode of the light-emitting diode OLED. In this case, the second signal S2 may not be generated, so that a voltage difference exists between the cathode and the anode of the light-emitting diode OLED, and thus the light-emitting diode OLED emits light. When the second signal S2 is generated, and is the same as the fourth signal S4, there is no voltage difference between the cathode and the anode of the light-emitting diode OLED (or the voltage difference is less than the threshold voltage of the light-emitting diode OLED), the light-emitting diode OLED is turned off.

It will be understood that in the signal identification system provided in the embodiment of the present disclosure, the first receiving circuit 101 receives the first electromagnetic wave S0 to obtain the first signal S1, the second receiving circuit 102 amplifies the first signal S1 to obtain the second signal S2, the third receiving circuit 103 receives the third signal S3 to obtain the fourth signal S4, and the first signal S1 has the same frequency as the third signal S3. Therefore, when the light-emitting diode OLED is turned off, it is indicated that the second signal S2 is the same as the fourth signal S4, and in this case, the signal identification system is capable of identifying the frequency of the first signal or the third signal. That is, when the first signal S1 and the third signal S3 with the same frequency are transmitted and received, it is possible to make the second signal S2 the same as the fourth signal S4, and in this case, the light-emitting diode OLED is turned off. When the light-emitting diode OLED is turned off, the signal identification system in the embodiments of the present disclosure is capable of identifying a signal of a specific frequency (i.e., the frequency of the first signal or the third signal).

In some embodiments, as shown in FIG. 2, the second receiving circuit 102 includes a plurality of stages of receiving sub-circuits connected in series. The plurality of stages of receiving sub-circuits include a first-stage receiving sub-circuit 1021, a second-stage receiving sub-circuit 1022 . . . and an nth-stage receiving sub-circuit 102n, and n is an integer greater than or equal to 3. The number of the plurality of stages of receiving sub-circuits included in the second receiving circuit 102 is not limited in the embodiments of the present disclosure.

Each stage of receiving sub-circuit is configured to amplify the amplitude of the first signal S1, and the plurality of stages of receiving sub-circuits are configured to amplify the amplitude of the first signal S1 stage by stage. For example, as shown in FIGS. 2 and 3, the first-stage receiving sub-circuit 1021 is configured to amplify the amplitude of the first signal S1 to obtain and output a first-stage amplified signal S11 to the second-stage receiving sub-circuit 1022. The second-stage receiving sub-circuit 1022 is configured to amplify the first-stage amplified signal S11 to obtain and output a second-stage amplified signal S12 to the third-stage receiving sub-circuit 1023. By analogy, the nth-stage receiving sub-circuit 102n is configured to amplify an (nth−1)-stage amplified signal to obtain and output an nth-stage amplified signal. The nth-stage amplified signal is the second signal S2. Compared with a method of amplifying the first signal S1 once to obtain the second signal S2, the method of amplifying the first signal S1 stage by stage through the plurality of stages of receiving sub-circuits is more controllable, and an appropriate amplification factor may be set for each stage of receiving sub-circuit, so that the output second signal S2 is more stable.

In some embodiments, amplification factors of different receiving sub-circuits in the plurality of stages of receiving sub-circuits included in the second receiving circuit 102 may be the same or different, or may be partially the same, which is not limited.

In some embodiments, the amplification factor of each stage of receiving sub-circuit may be 3 to 5. That is, each stage of receiving sub-circuit may amplify its received signal by 3 to 5 times, and then output the amplified signal. The amplification factor of each stage of receiving sub-circuit is not limited in the embodiments of the present disclosure, and the amplification factor of each stage of receiving sub-circuit is related to an inductance value of an inductor in this stage of receiving sub-circuit. In practical applications, the amplification factor of each stage of receiving sub-circuit may be set according to different application scenes.

In some embodiments, as shown in FIGS. 2 and 3, each stage of receiving sub-circuit includes an amplifying device Ix (e.g., I1, I2 . . . In), a first inductor Hx (e.g., H1, H2 . . . Hn) and a rectifying device Lx (e.g., L1, L2 . . . Ln). The amplifying device Ix is coupled to the first receiving circuit 101, and is configured to amplify the amplitude of the first signal S1 output from the first receiving circuit 101. The first inductor Hx is coupled to the amplifying device Ix, and is configured to receive the third signal S3 from the second transmitting circuit 202 to generate a current for supplying power to the amplifying device Ix. The rectifying device Lx is coupled between the amplifying device Ix and the first inductor Hx, and is configured to rectify the current generated by the first inductor Hx.

For example, the amplifying device may be an inverter. As shown in FIG. 3, the amplifying device Ix includes an inverter I1, an inverter I2 . . . or an inverter In. The first inductor Hx includes a first inductor H1, a first inductor H2 . . . or a first inductor Hn. The rectifying device Lx includes a rectifying device L1, a rectifying device L2 . . . or a rectifying device Ln. In some embodiments, the inductor H0 may also be referred to as a transmitting coil, and the first inductor Hx (e.g., H1, H2 . . . Hn) and the second inductor Ht each may also be referred to as a receiving coil.

As shown in FIG. 3, a first terminal of the inverter I1 in the first-stage receiving sub-circuit 1021 is coupled to the output terminal of the first receiving circuit 101; a second terminal of the inverter I1 in the first-stage receiving sub-circuit 1021 is coupled to a first terminal of the inverter I2 in the second-stage receiving sub-circuit 1022; a third terminal of the inverter I1 in the first-stage receiving sub-circuit 1021 is coupled to a terminal of the first inductor H1; another terminal of the first inductor H1 is coupled to a terminal of the rectifying device L1; and another terminal of the rectifying device L1 is coupled to a fourth terminal of the inverter I1 in the first-stage receiving sub-circuit 1021. A second terminal of the inverter I2 in the second-stage receiving sub-circuit 1022 is coupled to a first terminal of the inverter I3 in the third-stage receiving sub-circuit 1023; a third terminal of the inverter I2 in the second-stage receiving sub-circuit 1022 is coupled to a terminal of the first inductor H2; another terminal of the first inductor H2 is coupled to a terminal of the rectifying device L2; and another terminal of the rectifying device L2 is coupled to a fourth terminal of the inverter I2 in the second-stage receiving sub-circuit 1022. Connections of the amplifying device Ix, the first inductor Hx and the rectifying device Lx in other receiving sub-circuit are similar to those of the first receiving sub-circuit 1021 or the second receiving sub-circuit 1022, and are not repeated here.

For example, the structure of the inverter may be realized by a low temperature polysilicon (LTPS) thin film transistor (e.g., p-type transistor, n-type transistor), an indium gallium zinc oxide (IGZO) thin film transistor or other oxide thin film transistor (TFT) (e.g., n-type transistor), an amorphous silicon TFT (e.g., n-type transistor), a carbon nanotube (e.g., p-type transistor), or a two-dimensional material (e.g., p-type transistor, n-type transistor). The specific structure of the inverter is not limited in the embodiments of the present disclosure.

In some embodiments, as shown in FIG. 4, the amplifying device may include an amplifier. In a case where the amplifying device includes the amplifier, the amplifier does not convert the phase of the first signal S1 when amplifying the amplitude of the first signal S1. Therefore, the first signal S1 and the third signal S3 must be same in phase to ensure the normal operation of the signal identification system, and the number of the amplifiers may be even or odd. The number of the amplifiers is not limited in the embodiments of the present disclosure, and may be set according to different application scenes in practical applications. The inverter has a lower requirement for a power supply, and the inverter may be driven by a direct-current power supply. Therefore, in a case where the amplifying device is the inverter, the flexible system is more conveniently realized. In following embodiments, a description will be made in an example where the amplifying device is the inverter.

When the inductor H0 in the second transmitting circuit 202 transmits the third signal S3, due to electromagnetic induction between the inductors, the first inductor H1, the first inductor H2 . . . the first inductor Hn in the stages of receiving sub-circuits may sense respective third signals S3, and generate respective induced currents for respectively supplying power to the inverter I1, the inverter I2 . . . the inverter In in the stages of receiving sub-circuits, so that the second receiving circuit 102 does not need an external power source.

In some embodiments, in order to ensure that the amplification factors of the amplifying devices are increased stage by stage, the inductance values of the first inductor H1, the first inductor H2 . . . and the first inductor Hn may be increased stage by stage. That is, the inductance value of the first inductor H1 is less than the inductance value of the first inductor H2 . . . the inductance value of the first inductor Hn−1 is less than the inductance value of the first inductor Hn. The inductance values of the first inductor H1, the first inductor H2 . . . and the first inductor Hn are not limited in the embodiments of the present disclosure, and in practical applications, the inductance value of each first inductor may be set according to different application scenes.

In some embodiments, an inductance value of the second inductor Ht is greater than the inductance value of the first inductor Hx in each stage of receiving sub-circuit. That is, the inductance value of the second inductor Ht is greater than the inductance value of each of the first inductor H1, the first inductor H2 . . . and the first inductor Hn. The light-emitting diode OLED is turned off only when the second signal S2 is the same as the fourth signal S4, the second signal S2 is obtained by multi-stage amplification of the first signal S1 by the plurality of first inductors Hx, and the fourth signal S4 is obtained directly from the second inductor Ht in response to the third signal S3. Therefore, the second signal S2 is able to be the same as the fourth signal S4 only when the inductance value of the second inductor Ht is greater than that of each of the first inductor H1, the first inductor H2 . . . and the first inductor Hn. The inductance value of the second inductor Ht may be derived from the inductance values of the first inductor H1, the first inductor H2 . . . and the first inductor Hn in the plurality of stages of receiving sub-circuits, and the inductance values of the first inductor H1, the first inductor H2 . . . and the first inductor Hn and the second inductor Ht are not limited. In practical applications, the inductance value of the second inductor Ht may be set according to different application scenes.

In some embodiments, in the plurality of stages of receiving sub-circuits, the inductance value of the first inductor Hn in the last-stage receiving sub-circuit may be the same as the inductance value of the second inductor Ht. For example, as shown in FIG. 3, the inductance value of the first inductor Hn may be the same as the inductance value of the second inductor Ht, so that the amplitude of the second signal S2 and the amplitude of the fourth signal S4 have a small difference therebetween. Thus, when the first signal S1 and the third signal S3 with the same frequency are transmitted and received, the second signal S2 and the fourth signal S4 have the same phase, and have the small difference in amplitude, so that the light-emitting diode OLED is able to be ensured to be always in the off state, and thus the signal with the specific frequency (i.e., the frequency of the first signal or the third signal) is able to be identified more accurately.

For example, as shown in FIG. 3, in each stage of receiving sub-circuit, a current generated by each first inductor is rectified by a diode and flows to the inverter, so as to supply a stable current to the inverter.

As shown in FIG. 3, the second receiving circuit 102 operates as follows.

The first receiving circuit 101 outputs the first signal S1. In the first-stage receiving sub-circuit 1021, the first inductor H1 senses the third signal S3 and generates a current, and this current flows to the inverter I1 through a diode L1 and drives the inverter I1 to amplify the amplitude of the first signal S1, so that the phase of the first signal S1 is converted into an opposite phase to obtain and output the first-stage amplified signal S11 to an input terminal (i.e., first terminal) of the inverter I2. In the second-stage receiving sub-circuit 1022, the first inductor H2 senses the third signal S3 and generates a current, and this current flows to the inverter I2 through a diode L2 and drives the inverter I2 to amplify the amplitude of the first-stage amplified signal S11, so that the phase of the first signal S1 is converted into an opposite phase to obtain and output the second-stage amplified signal S12 to an input terminal (i.e., first terminal) of the inverter I3. By analogy, in the nth-stage receiving sub-circuit 102n, the first inductor Hn senses the third signal S3 and generates a current, and this current flows to the inverter In through a diode Ln and drives the inverter In to amplify the amplitude of the (nth−1)-stage amplified signal S(In−1), so that the phase of the first signal S1 is converted into an opposite phase to obtain and output the nth-stage amplified signal to the light-emitting diode OLED. The nth-stage amplified signal is the second signal S2.

In some embodiments, the first signal S1 has the same frequency as the third signal S3, and the first signal S1 and the third signal S3 may be same or opposite in phase. The light-emitting device 104 is turned off only when the second signal S2 is the same as the fourth signal S4, the second signal S2 is obtained by the multi-stage amplification of the first signal S1 by the plurality of first inductors, and the fourth signal S4 is obtained directly from the second inductor Ht in response to the third signal S3. Therefore, in order to make the second signal S2 the same as the fourth signal S4, the first signal S1 and the third signal S3 must have the same frequency. It will be exemplarily described below how the second signal S2 is the same as the fourth signal S4 in a case where the first signal S1 and the third signal S3 are same or opposite in phase.

For example, as shown in FIG. 3, when the first signal S1 and the third signal S3 are same in phase, the number n of the inverters included in the second receiving circuit 102 is an even number, and the first signal S1 is inverted the even number of times by the inverters Ix. That is, the nth-stage amplified signal output from the inverter In has the same phase as the first signal S1. That is, the second signal S2 has the same phase as the first signal S1. Since the first signal S1 and the third signal S3 are same in phase, and the fourth signal S4 and the third signal S3 are same in phase, the second signal S2 and the fourth signal S4 are same in phase.

For example, as shown in FIG. 5, when the first signal S1 and the third signal S3 are opposite in phase, the number n of the inverters included in the second receiving circuit 102 is an odd number, and the first signal S1 is inverted the odd number of times by the inverters Ix. That is, the nth-stage amplified signal output from the inverter In has an opposite phase to the first signal S1. That is, the second signal S2 and the first signal S1 are opposite in phase. Since the first signal S1 and the third signal S3 are opposite in phase, and the fourth signal S4 and the third signal S3 are same in phase, the second signal S2 and the fourth signal S4 are same in phase.

In some embodiments, the frequency of the first signal S1 is in a range of 1 kHz to 20 KHz, inclusive. The signal identification system in the embodiments of the present disclosure may be used for identifying the signal with the specific frequency, which may be a signal with a frequency in a range of 1 kHz to 20 kHz, inclusive. It will be exemplarily described below how the signal identification system in the present disclosure identifies the signal with the specific frequency and does not identify a signal with a frequency except the specific frequency.

For example, in an example where the signal identification system is used for identifying a signal with a specific frequency of 12 kHz, the first signal S1 and the third signal S3 each have a frequency of 12 kHz. Only when the first signal S1 with the frequency of 12 kHz and the third signal S3 with the frequency of 12 kHz are transmitted, due to the principle of electromagnetic induction, the second inductor Ht senses the third signal S3 with the frequency of 12 kHz and generates a current, and this current may drive the light-emitting diode OLED to emit light and output the fourth signal S4 to the anode of the light-emitting diode OLED. The frequency of the fourth signal is also 12 kHz. The first inductor Hx senses the third signal S3 with the frequency of 12 kHz synchronously and generates a current, and this current is rectified by the diode Lx to drive the inverter Ix. The first signal S1 with the frequency of 12 kHz is amplified stage by stage by the inverters Ix to output the second signal S2, and the frequency of the second signal S2 is also 12 kHz. By setting the inductance values of the first inductors and the second inductor Ht, the amplitude of the second signal S2 may be the same as the amplitude of the fourth signal S4. If the second signal S2 and the fourth signal S4 are same in phase, the second signal S2 and the fourth signal S4 are completely the same, so that there is no voltage difference between the cathode and the anode of the light-emitting diode OLED, and the light-emitting diode OLED is turned off. When the light-emitting diode OLED is turned off, the signal identification system in the embodiments of the present disclosure may be determined to identify the signal with the specific frequency, i.e., the signal with the frequency of 12 kHz.

For example, in the example where the signal identification system is used for identifying the signal with the specific frequency of 12 kHz, if a first interference signal with a frequency of 18 kHz exists in an identification range of the signal identification system, the second inductor Ht may respond to the first interference signal and generate a fourth signal S4 corresponding to the first interference signal. However, since the first antenna A1 cannot receive the first interference signal, a second signal S2 corresponding to the first interference signal is not generated. In this case, since the second signal S2 is different from the fourth signal S4, the light-emitting diode OLED is not turned off. That is, the signal identification system in the embodiments of the present disclosure is capable of distinguishing that the first interference signal does not include the signal with the specific frequency of 12 kHz.

For example, in the example where the signal identification system is used for identifying the signal with the specific frequency of 12 kHz, a second interference signal exists in the identification range of the signal identification system in the embodiments of the present disclosure. The second interference signal is obtained by modulating a signal with a frequency of 18 kHz by a second carrier wave. The frequency of the first antenna A1 is the same as that of the first carrier wave, and it is difficult to reversely study the frequency of the first carrier wave without knowing the frequency of the first carrier wave. Therefore, it is difficult to adjust a frequency of the second carrier wave to be the same or approximately the same as the frequency of the first carrier wave. For example, in a case where the frequency of the first carrier wave is 200 MHz, and the frequency of the second carrier wave is 150 MHz, i.e., in a case where the frequencies of the first carrier wave and the second carrier wave are not matched, the first signal S1 is represented as a direct current, and the second signal S2 is also represented as a direct current. Therefore, even if the second inductor Ht may respond to the second interference signal and generate the fourth signal S4 corresponding to the second interference signal, since the second signal S2 is different from the fourth signal S4 in this case, the light-emitting diode OLED is not turned off. That is, the signal identification system in the embodiments of the present disclosure is capable of distinguishing that the second interference signal does not include the signal with the specific frequency of 12 kHZ.

In any one of the above embodiments, the first transmitting circuit 201 modulates the first signal onto the first carrier wave with the high frequency to generate the first electromagnetic wave, and the second antenna A0 transmits the first electromagnetic wave with the high frequency. That is, a low-frequency signal is transmitted by using a high-frequency carrier wave in the embodiments of the present disclosure. Since the high-frequency carrier wave itself is sensitive to the design of a receiving antenna, the receiving antenna is difficult to be forged, so that a receiving terminal is able to be prevented from being forged to a great extent. Due to electromagnetic induction between the inductor H0 and the first inductor, the current may be generated to drive the inverter, so that the inverter does not need an external power source. Due to electromagnetic induction between the inductor H0 and the second inductor Ht, the current flowing to the light-emitting diode OLED may be generated. Thus, the signal identification system in the embodiments of the present disclosure may accurately identify the signal with the specific frequency, and does not need an external power source, thereby realizing the flexible system.

Some embodiments of the present disclosure further provide a signal receiving device, which may be the signal receiving device 100 in any one of the above embodiments. The structure and function of the signal receiving device 100 will not be repeated here.

Some embodiments of the present disclosure further provide a signal identification method, which is applied to the signal identification system in any one of the above embodiments. As shown in FIG. 6, the method includes following steps.

In Step 601, the first receiving circuit 101 receives the first electromagnetic wave S0 from the first transmitting circuit 201, and obtains the first signal S1 from the first electromagnetic wave S0. The first transmitting circuit 201 is configured to modulate the first signal S1 onto the first carrier wave to generate the first electromagnetic wave S0.

In Step 602, the second receiving circuit 102 amplifies the amplitude of the first signal S1 output from the first receiving circuit 101 to obtain the second signal S2.

In Step 603, the third receiving circuit 103 receives the third signal S3 from the second transmitting circuit 202, and outputs the fourth signal S4. When the second signal S2 is the same as the fourth signal S4, the light-emitting device 104 is in the off state; when the second signal S2 is different from the fourth signal S4, the light-emitting device 104 is in the light-emitting state.

The foregoing descriptions are merely some specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A signal receiving device, comprising:
   a first receiving circuit; wherein the first receiving circuit is configured to receive a first electromagnetic wave and obtain a first signal from the first electromagnetic wave; the first electromagnetic wave is an electromagnetic wave generated by modulating the first signal onto a first carrier wave;
   a second receiving circuit; wherein the second receiving circuit is coupled to the first receiving circuit, and is configured to amplify an amplitude of the first signal output from the first receiving circuit to obtain a second signal;
   a third receiving circuit; wherein the third receiving circuit is configured to receive a third signal and output a fourth signal; and
   a light-emitting device; wherein the light-emitting device is coupled between the second receiving circuit and the third receiving circuit, and is configured to be in an off state when the second signal is the same as the fourth signal and in a light-emitting state when the second signal is different from the fourth signal.

2. The signal receiving device according to claim 1, wherein the second receiving circuit is further configured to receive the third signal.

3. The signal receiving device according to claim 1, wherein the second receiving circuit includes a plurality of stages of receiving sub-circuits connected in series; each stage of receiving sub-circuit includes:
   an amplifying device; wherein the amplifying device is coupled to the first receiving circuit, and is configured to amplify the amplitude of the first signal output from the first receiving circuit;
   a first inductor; wherein the first inductor is coupled to the amplifying device, and is configured to receive the third signal and supply power to the amplifying device; and
   a rectifying device; wherein the rectifying device is coupled between the amplifying device and the first inductor, and is configured to rectify an induced current generated by the first inductor.

4. The signal receiving device according to claim 3, wherein inductance values of first inductors in the plurality of stages of receiving sub-circuits connected in series are increased stage by stage.

5. The signal receiving device according to claim 3, wherein the amplifying device is an amplifier or an inverter.

6. The signal receiving device according to claim 5, wherein the first signal and the third signal are same in frequency, and the first signal and the third signal are same or opposite in phase.

7. The signal receiving device according to claim 6, wherein in a case where the amplifying device is the inverter, the second receiving circuit includes an even number of inverters when the first signal and the third signal are same in phase; the second receiving circuit includes an odd number of inverters when the first signal and the third signal are opposite in phase.

8. The signal receiving device according to claim 3, wherein the third receiving circuit includes a second inductor, and an inductance value of the second inductor is greater than an Inductance value of the first inductor.

9. The signal receiving device according to claim 3, wherein the third receiving circuit includes a second inductor; an inductance value of a first inductor in a last-stage receiving sub-circuit in the plurality of stages of receiving sub-circuits is same as an inductance value of the second inductor.

10. A signal identification system comprising a signal transmitting device and the signal receiving device according to claim 1, wherein the signal transmitting device includes a first transmitting circuit and a second transmitting circuit;
the first transmitting circuit is configured to modulate the first signal onto the first carrier wave to generate the first electromagnetic wave; and
the second transmitting circuit is configured to transmit the third signal.

11. The signal identification system according to claim 10, wherein a frequency of the first signal is in a range of 1 KHz to 20 kHz, inclusive.

12. The signal identification system according to claim 10, wherein the first receiving circuit includes a first antenna, and the first transmitting circuit includes a second antenna; a frequency of the first antenna is same as or similar to a frequency of the second antenna.

13. The signal identification system according to claim 12, wherein the frequency of the first antenna and the frequency of the second antenna are each greater than or equal to 100 MHz.

14. A signal identification method applied to the signal identification system according to claim 10, the signal identification method comprising:
receiving, by the first receiving circuit, the first electromagnetic wave from the first transmitting circuit, and obtaining, by the first receiving circuit, the first signal from the first electromagnetic wave;
amplifying, by the second receiving circuit, the amplitude of the first signal output from the first receiving circuit to obtain the second signal; and
receiving, by the third receiving circuit, the third signal from the second transmitting circuit, and outputting, by the third receiving circuit, the fourth signal; wherein the light-emitting device is in the off state when the second signal is the same as the fourth signal; the light-emitting device is in the light-emitting state when the second signal is different from the fourth signal.

15. The signal receiving device according to claim 2, wherein the second receiving circuit includes a plurality of stages of receiving sub-circuits connected in series; each stage of receiving sub-circuit includes:
an amplifying device; wherein the amplifying device is coupled to the first receiving circuit, and is configured to amplify the amplitude of the first signal output from the first receiving circuit;
a first inductor: wherein the first inductor is coupled to the amplifying device, and is configured to receive the third signal and supply power to the amplifying device; and
a rectifying device; wherein the rectifying device is coupled between the amplifying device and the first inductor, and is configured to rectify an induced current generated by the first inductor.

16. The signal receiving device according to claim 15, wherein inductance values of first inductors in the plurality of stages of receiving sub-circuits connected in series are increased stage by stage.

17. The signal receiving device according to claim 3, wherein an amplification factor of each stage of receiving sub-circuit is 3 to 5.

* * * * *